(12) United States Patent
Kim et al.

(10) Patent No.: US 6,333,214 B1
(45) Date of Patent: Dec. 25, 2001

(54) MEMORY OF MULTILEVEL QUANTUM DOT STRUCTURE AND METHOD FOR FABRICATING THE SAME

(75) Inventors: Ki Bum Kim; Tae Sik Yoon; Jang Yeon Kwon, all of Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 09/334,895

(22) Filed: Jun. 17, 1999

(30) Foreign Application Priority Data

Jun. 29, 1998 (KR) .................................. 98-25131

(51) Int. Cl.[7] .................................. H01L 21/335
(52) U.S. Cl. .................................. 438/142
(58) Field of Search .................. 438/142, 197, 438/257, 261, 264, 962; 257/9, 213, 288, 314, 315, 321, 322

(56) References Cited

U.S. PATENT DOCUMENTS 5,714,766 * 2/1998 Chen et al. ........................ 257/17

OTHER PUBLICATIONS

H.A. Atwater et al., "Group III–V and Group IV Quantum Dot Synthesis", in "Low dimensional structures . . . ", Kluwer, pp. 74–76 (no month given), 1995.*

Semiconductor Memory Process Integration (Chapter 8) pp. 567–642, No date.

* cited by examiner

*Primary Examiner*—Keith Christianson

(57) ABSTRACT

A semiconductor memory having a multilevel quantum dot structure is formed by alternatively disposing conductive layers and insulation layers, and processing these layers so that quantum dots are formed in the conductive layers. The writing and reading of data into the semiconductor memory are achieved by using the principle of Coulomb blockade and quantized voltage drops. The size and distribution of the quantum dots are controlled by agglomeration, selective oxidation, etc. in order to achieve the desired quantum dot layer structure so that the immigration of charges between a semiconductor channel and each quantum dot layer is different.

13 Claims, 4 Drawing Sheets

800°C

900°C

MEMORY OF MULTILEVEL QUANTUM DOT STRUCTURE AND METHOD FOR FABRICATING THE SAME

BACKGROUND OF THE INVENTION

1. Field of the Invention

The present invention relates to a semiconductor memory, and more particularly, to a memory of a multilevel quantum dot structure and a method for fabricating the same.

2. Background of the Related Art

It can be foreseen that the use of a MOS structure as a basic switching device will reach its limit as device packing density increases. In a case of the MOS structure with a device packing density in a range of 4 giga DRAM, a switching operation using a gate voltage in accordance with the principles of a MOS device operation will be impossible, because the distance between a source and a drain is reduced to approx. 0.13 $\mu$m (S. Wolf. "Silicon Processing; for the VLSI Era', V2, chap.8). Due to device malfunctions caused by tunnelling between the source and drain and tunnelling through a gate oxide film when no gate voltage is applied, the limit of an integration using the MOS structure will be approx. 4 giga DRAM. Therefore, in order to fabricate a device having a large density such as giga class, or the like a device other than the current MOS structure should be employed. The form of device suggested by many research groups is the SET (Single Electron Transistor) (see, K. K. Likharev, IBM J. Res. Develop. 32(1) p144(1988)). The SET is a device employing the so called Coulomb blockade effect pertaining to quantum effects exhibited by the interaction between electrons having a nano-scale dimension, whereby any further tunnelling of charges is suppressed during the process of tunnelling charge carriers such as (electrons or holes) through an insulating film, such that the individual flow of discrete electrons, can be controlled.

The principle of the Coulomb blockade effect caused by an SET tunnelling is as follows. (M. H. Devoret and H. Grabert, in "Single Charging Tunnelling", edited by H. Grabert and M. H. Devoret (Plenum N.Y., 1992) p1).

If the total capacitance caused by a region into which electrons enter through tunnelling is very small, a charge effect of the discrete electrons can be observed. If a charge energy $e^2/2C$ of the discrete electron charge is greater than an energy $k_BT$ of a thermal vibration (M. H. Devoret and H. Grabert, in "Single Charging Tunnelling", edited by H. Grabert and M. H. Devoret Plenum N.Y., 1992) p1), and there is no voltage increase applied externally when the temperature remains constant, an electron can not have the energy required for charging a capacitor by tunnelling. Accordingly, there is no further tunnelling occurred once one electron is charged. That is, since an electron previously tunnelled, and charged in a capacitor causes a low voltage having a level of at least a voltage drop at the capacitor, is applied to the next electron, the next electron does not achieve the level of energy required for charging by tunnelling, and thus no further tunnelling occurs. This effect of suppression of further tunnelling due to electrons that are already tunnelled called a Coulomb blockade effect. When an effective voltage applied to an electron in a double junction structure receiving an external voltage is V, the electron will have an energy of eV, and when the electron is charged in a capacitor by tunnelling, an energy loss amounting to the charged energy occurs. The effective voltage that this charge applies to the next charge is $$V - \frac{e}{2C}$$

such that the electron is to have an energy of $$eV - \frac{e^2}{2C}.$$

Because a subsequent electron to tunnel at a later time can not have the energy required for charging due to this energy difference occurs (even if an identical voltage is applied), further tunnelling occurs.

It is a basic concept of the SET that individual electrons are controlled to make a discrete movement using this Coulomb blockade effect. If thermal energy can complement the energy difference, the tunnelling of electrons can also occur without any increase in the applied external voltage. In order to suppress this undesirable tunnelling caused by thermal vibrations, an energy loss of $$\frac{e^2}{2C}$$

caused by the charging should be greater than the thermal energy $k_BT$. Therefore, in order to satisfy this condition, an overall capacitance of the system should be, for example, as small as 3 aF. Most of the SET devices reported currently have a large quantum dot formed such that a capacitance of greater than 3 aF is achieved, resulting in an operation temperature being maintained very low due to a thermal smearing effect. In order to cause the Coulomb blockade effect, in addition to the suppression of the thermal smearing by having the charge energy greater than the thermal energy, the following condition should also be satisfied (M. H. Devoret and H. Grabert, in "Single Charging Tunnelling", edited by H. Grabert and M. H. Devoret (Plenum N.Y., 1992) p1).

$Rt>>Rk$, where Rt is a tunnelling resistance, and Rk is a resistance quantum (=25.8 k$\Omega$). The above condition, coming from the theory of uncertainty, implies that the above condition should be satisfied for preventing an occurrence of tunnelling, because tunnelling can occur without any increase of external voltage if the range of energy variation of an electron is greater than the charged energy.

$$\Delta E \Delta t \geq \frac{h}{2} \text{ (Theory of uncertainty)}$$

Two types of the SET structures using the Coulomb blockade effect have been known. One type, like a MOS structure, has a source, a drain, and a gate, with a channel having conductive quantum dots for facilitating a discrete electron flow. Therefore, the channel consists of an insulating material and the conductive quantum dots, facilitating an electron flow by using discrete tunnelling. That is, the channel has quantum dots contained in the insulating material. (K. Nakazato, T. J. Thornton, J. White, and H. Ahmed, Appl. Phys. Lett. 61(26), 3145(1992); D. J. Paul, J. R. A. Cleaver, H. Ahmed, and T. E. Whall, Appl. Phys. Lett. 63(5), 631(1993); D. Ali and H. Ahmed, Appl. Phys. Lett. 64(16), 2119(1994); E. Leobandung, L. Guo, Y. Wang, and S. Y. Chou, Appl. Phys. Lett. 67(7), 938(1995); K. Nakazato, R. J. Blankie, and H. Ahmed, J. Appl. Phys. 75(10), 5123 (1992); Y. Takahashi, M. Nagase, H. Namatsu, K. Kurihara, K. Iwdate, Y. Iwadate, Y. Nakajima, S. Horiguchi, K. Murase, and M. Tabe, IEDM 1994, p938; E. Leobandung, L. Guo, and S. Y. Chou, IEDM 1995, p367; O. I. Micic, J. Sprague, Z. Lu, and A. J. Nozik, Appl. Phys. Lett. 68(22), 3150(1996)). In the formation of the quantum dots, a variety of methods can be employed. The quantum dots may be formed in an insulating material by EBL(Electron Beam Lithography) and RIE(Reactive Ion Etching)(Nakazato, T. J. Thornton, J. White, and H. Ahmed, Appl. Phys. Lett. 61(26), 3145(1992); D. J. Paul, J. R. A. Cleaver, H. Almed, and T. E. Whall, Appl. Phys. Lett. 63(5), 631(1993); D. Ali and H. Ahmed, Appl. Phys. Lett. 64(16), 2119(1994); E. Leobandung, L. Guo, Y. Wang, and S. Y. Chou, Appl. Phys. Lett. 67(7), 938(1995); K Nakazato, R. J. Blankie, and H. Ahmed, J. Appl. Phys. 75(10), 5123(1992); Y. Takahashi, M. Nagase, H. Namatsu, K. Kurihara, K. Iwadate, Y. Takahashi, M. Nagase, H. Murase, and M. Tabe, IEDM 1994, p938; E. Leobandung, L. Guo, and S. Y. Chou, IEDM 1995, p367), or by applying an electric field to a doped substrate to form local conductive regions (H. Matsuoka and S. Kimura, Appl. Phys. Lett 66(5), 613(1995)). Nano scale quantum dots may be formed by chemical synthesis (N. Uyeda, J. Colloidal Interface Science 43, 264(1973); A. A. Guzelian, U. Banin, A. V. Kadavanich, X. Peng, and A. P. Alivisatos, Appl. Phys. Lett 69(10), 1432(1996)), or by cluster beam deposition (W. Chen, H. Ahmed, and K. Nakazato, Appl. Phys. Lett 66(24), 83(1995)).

In the aforementioned form of devices, a current-to-voltage curve has an ideal stepped form due to electrons passed through the channel by tunnelling and blocking the next incoming electrons. These different currents are used to provide memory capabilities. Although the Coulomb blockade effect required for an SET device is sometimes exhibited even though the channel through which electrons move is formed by a two dimensional conductive line (M. A. Kastner, Rev. Mod. Phys. 64(3), 849(1992); R. A. Smith and H. Ahmed, J. Appl. Phys. 81(6), 2699(1997)), the quantum dots should be contained in an insulating material for the most stable induction of discrete electron tunnelling. Accordingly, this type of device uses a quantized change of a current exhibited through a Coulomb blockage effect between tunnelling electrons.

Another form of the SET device is a device in which, while having a structure similar to the MOS structure like the aforementioned devices, floating dots are formed in a gate oxide film for charging electrons in a channel in the floating dots to reduce a current flowing through the channel (S. Tiwari, F. Rana, H. Hanafi, A. Hartstein E. F. Crabbe, and K. Chan, Appl. Phys. Lett. 68(10), 1377(1994); K. Yano, T. Ishii, T. Hashimoto, T. Kobayashi, F. Murai, and K. Seki, IEEE Trans. Electron Devices 41(9), 1628(1994); A. Nakajima, T. Futatsufgi, K. Kosemura, T. Fukano, and N. Yokoyama, Appl. Phys. Lett. 70(13), 142(1997)). This form of device is similar to an EPROM(Electrically Programmable Read Only Memory) using the hot carrier effect in a reverse manner, in which electrons charged in the floating dots reduce a voltage applied to an underlying channel, thereby current flowing through the channel is reduced. In order for the current to exhibit a quantized change in the charge of electrons, the Coulomb blockade effect should appear, in which any further continuous charging of electrons is prevented by electrons already charged in the floating quantum dots. Due to the Coulomb blockade effect, electrons present in the channel are charged in the floating quantum dots only at a particular voltage exceeding the Coulomb blockade effect, resulting in the current flowing through the channel to exhibit a quantized reduction. By sensing the quantized reduction of the current, a memory function can be provided.

A conventional SET memory using a single layered floating quantum dot will be explained with reference to the attached drawings. FIG. 1 illustrates a section of a general $E^2$PROM memory cell, and FIG. 2 schematically illustrates a double junction structure using single layered floating quantum dots.

A result of calculation of an SET device using the single layered floating dots

The general $E^2$PROM memory cell is provided with a tunnelling insulating film 2 formed on a semiconductor substrate 1, a floating gate 3 formed on the tunnelling insulating film 2, an insulating film 4 on the floating gate 3, a control gate 5 on the insulating film 4, and source/drain impurity regions 6 and 7 formed in the semiconductor substrate 1 on both sides of the floating gate 3.

The operation of the aforementioned general $E^2$PROM memory cell will be explained. First, the operation for writing "1" on the $E^2$PROM memory cell will be explained.

When the semiconductor substrate 1 and the source impurity region 6 are grounded, the drain impurity region 7 receives a voltage of approx. 7~8V, and the control gate 5 receives a voltage of 12~13V, an avalanche breakdown occurs at a pn junction between the drain impurity region 7 and the substrate 1, causing the generation of hot electrons. Of the hot electrons generated, a portion thereof obtains an energy greater than an energy barrier height (approx. 3.2 eV) between the substrate 1 and the tunnelling insulating film 2. Those electrons go over the tunnelling insulating film 2 from the substrate 1, and enters into the floating gate 3. In this instance, as the number of electrons stored in the floating gate 3 gradually increases, a cell threshold voltage is increased. In general, "writing" into the memory cell is performed until the cell threshold voltage becomes higher than 7V. Once the electrons are stored in the floating gate 3, the stored electrons can be kept therein for a few years with almost no change because of the negligible natural electron discharge over the height of the energy barrier between the floating gate 3 and the insulating films 2 and 4 above and below the floating gate (which is high greater than 3 eV).

The operation of erasing the data "1" written in the $E^2$PROM memory cell will be explained.

When 12~13V is applied to the source impurity region 6 while the substrate 1 and the control gate 5 are grounded and the drain impurity region 7 is floated, the electrons stored in the floating gate 3 are discharged therefrom to the source impurity region 6 through the tunnelling insulating film 2 according to the Fowler-Nordheim tunneling effect. In this instance, as the number of electrons discharged from the floating gate 3 is increased, the cell threshold voltage drops. In general, an "erasure" is made until the cell threshold voltage drops below 3V. A tunneling voltage of an electron from a channel to a floating dot (floating gate) and a consequential current change in a device having the aforementioned single layered floating dots can be calculated as follows.

Referring to FIG. 1, when it is assumed that respective junction capacitances and voltages are denoted as Cg, Cc, Vg, and Vc in a double junction (J. R/ Tucker, J. Appl. Phys. 72(9), 4399(1992)) of the single layered floating quantum dots, a voltage drop and a $V_G$ required for charging can be calculated according to the following equations for both cases when an extra electron is charged and not charged.

1) When no extra electron is charged

According to $Vg+Vc=V_G$ and a charge neutrality, the relationship of $CgVg=CcVc$, i.e., $$Vg = \frac{Cc}{Cg} Vc$$

exists. According to the above two equations, Vc can be expressed by equation (1), below.

$$Vc = \frac{V_G}{\left(1 + \frac{Cc}{Cg}\right)} \quad (1)$$

The device activation uses a difference of currents flowing through a channel, which difference is fixed according to a difference of voltages required for forming an inversion layer in the channel. Therefore, different currents flow through the channel due to from a difference of Vc.

2) When one extra electron is charged in the floating quantum dot $$Vg+Vc=V_G$$

As the extra electron is charged in the floating quantum dot by a gate voltage applied from outside of the device, a charge neutrality of the system is changed. Polarization charges formed from voltages applied to respective junctions can not make the neutrality matched, exhibiting an overall charge state of the floating quantum dots to be −e. This charge neutrality can be expressed by equation (2) shown below.

$$CgVg-CcVc=e, \ e=1.6\times10^{-19}C \quad (2)$$

Therefore, the voltage Vc charged to the channel can be expressed by equation (3) shown below.

$$Vc = \frac{V_G - \frac{e}{Cg}}{\left(1 + \frac{Cc}{Cg}\right)} \quad (3)$$

Therefore, a change of voltage applied to the channel caused by charging of the extra electron in the floating dot can be expressed by equation (4) shown below.

$$\Delta Vc = \frac{e}{Cg + Cc} \quad (4)$$

The voltage applied on the channel is reduced by $\Delta Vc$, and the voltage drop reduces the current flowing through the channel. The voltage drop caused by the electron charge is occurred at a particular gate voltage, and a quantized change is exhibited in a current-to-voltage. A voltage which should be applied to the device for causing a charge of an extra electron into the floating quantum dots which causes the voltage drop can be expressed as shown below. Because a difference of energies between an electron charged state and no electron charged state should be supplied, this charge energy difference can be calculated by equation (5) as follows.

$$\begin{aligned} \Delta E &= \left(\frac{1}{2}CgV'g^2 + \frac{1}{2}CcV'c^2\right) - \left(\frac{1}{2}CgVg^2 + \frac{1}{2}CcVc^2\right) \\ &= \frac{1}{2}Cg(Vg+\Delta Vg)^2 + \frac{1}{2}Cc(Vc-\Delta Vc)^2 - \\ &\quad \left(\frac{1}{2}CgVg^2 + \frac{1}{2}CcVc^2\right) \\ &= \frac{1}{2}\left(\frac{e}{Cg+Cc}\right)^2(Cg+Cc) \\ &= \frac{1}{2}\frac{e^2}{(Cg+Cc)} = eV_G \end{aligned} \quad (5)$$

where, V'g and V'c denote voltages after charging.

Therefore, charging of an extra electron is possible only when the $V_G$, an external voltage applied to the device, can make up the energy difference, which is called a Coulomb gap. That is, an electron tunneling is possible to the floating quantum dot at $$V_G = \frac{e}{2(Cg+Cc)}.$$

When capacitances of respective junctions are 1.6 aF respectively, the voltage at which the voltage drop and the tunneling are occurred can be expressed as follows.

$$\Delta Vc = \frac{e}{Cg+Cc} = 0.05 \text{ V}$$

$$V_G = \frac{e}{2(Cg+Cc)} = 0.025 \text{ V}$$

If the gate oxide film is formed thicker in order to lower Cg down to 1 aF for prevention of a malfunction of the device due to re-tunneling of the electrons charged in the floating quantum dots to the gate, $\Delta Vc=0.615V$ and $V_G=0.307V$, at which a tunneling occurs. As seen from the aforementioned equations, a gate voltage at which one extra electron can be charged is $$\frac{e}{2(Cg+Cc)}$$

and a channel voltage Vc at this time is $$\frac{e^2 Cg}{2(Cg+Cc)^2}.$$

And, a channel voltage shift $\Delta Vc$ from this charging of the extra electron is $$\frac{e}{Cg+Cc}.$$

As the charging is performed, the Vc after the charging has a negative (−) value because $\Delta Vc$ is greater than the Vc before charging, and no further tunnel occurs.

A gate voltage which should be applied from outside of the device for charging one more extra electron in the floating quantum dot is $$\frac{2e}{Cg+Cc}$$

and the Vc is $$\frac{e\left(\frac{2Cg}{Cg+Cc}-1\right)}{(Cg+Cc)}.$$

That is, in order to charge a second electron when a first electron charged in the floating quantum dot is not discharged to the gate electrode, the Vc should have a positive value. That is, 2Cg>Cg+Cc, i.e., Cg>Cc. That is, even if an energy required for charging an electron is applied to the device from outside of the device, an electron movement occurs at another junction if a voltage applied to the channel is negative. The movement of electrons between the channel and the floating quantum dots may cause malfunction of the device. Also, the deposition of the gate oxide film to be thicker than the tunnel oxide film required for preventing escape of the electrons charged in the floating quantum dots into the gate is not easily achieved. And, it is presumed the problem of co-tunneling (D. V. Averin and Y. V. Nazarov, in "Single Charging Tunneling", edited by H. Grabert and M. H. Devoret (Plenum, N.Y., 1992) p217; L. J. Geerlings, in "Physics of Nanostructures", edited by J. H. Davies and A. R. Long (The Scottish Universities Summer School in Physics, 1992) which arises as a problem in the SET is more sensitive in the case of the single layered floating quantum dot and co-tunneling will cause a problem in a reliability of the device. These are the reasons why the single layered floating quantum dots are not used in the fabrication of multiple digit devices.

As explained, the voltage applied to the channel drops whenever an electron tunnels from the channel to the floating quantum dot. If this voltage drop occurs at various levels of gate voltages periodically, this voltage drop facilitates, other than the on/off switching used in an MOS up to now, a multi-digit storage function in which different information can be made distinctive even in one device. However, the single layered floating quantum dots have a problem in that charging of an extra electron in addition to a previously charged extra electron is not easily achieved.

SUMMARY OF THE INVENTION

Accordingly, the present invention is directed to a memory of a multilevel quantum dot structure and a method for fabricating the same that substantially obviates one or more of the problems due to limitations and disadvantages of the related art.

The present invention provides a memory of a multilevel quantum dot structure and a method for fabricating the same which can solve the problems arising in the case of using a single layered floating quantum dots.

Additional features and advantages of the invention will be set forth in the description which follows, and in part will be apparent from the description, or may be learned by practice of the invention. Other advantages of the invention will be realized and attained by the structure particularly pointed out in the written description and claims hereof as well as the appended drawings.

To achieve these and other advantages and in accordance with the present invention, as embodied and broadly described, the memory of a multilevel quantum dot structure includes a semiconductor substrate, a plurality of layers of quantum dots stacked on the semiconductor substrate, a plurality of insulating layers on, beneath, and between the quantum dots, a control gate on a top insulating layer, and source/drain impurity regions in the semiconductor substrate on both sides of the control gate.

In another aspect of the present invention, there is provided a method for fabricating a semiconductor memory of a multilevel quantum dot structure, including the steps of (1) forming a first insulating layer on a substrate, (2) repeating formation of a conductive layer and a second insulating layer on the first insulating layer at least once, and (3) agglomerating each of the conductive layers to form quantized dot layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
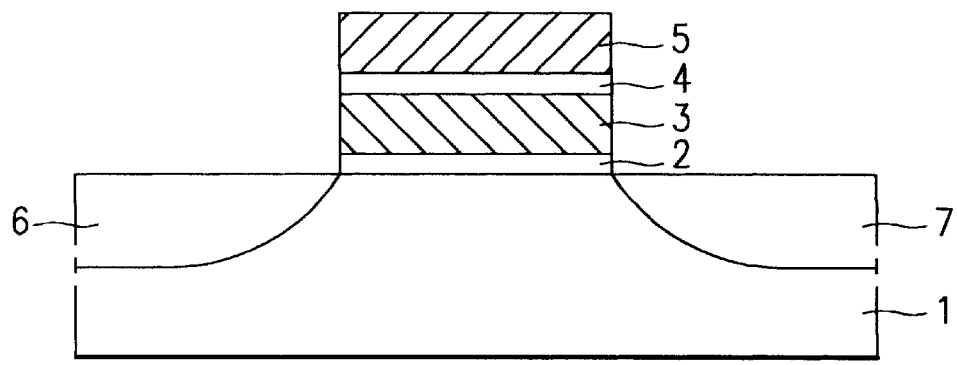
FIG. 1 illustrates a section of a general E²PROM memory cell.
Figure 2:
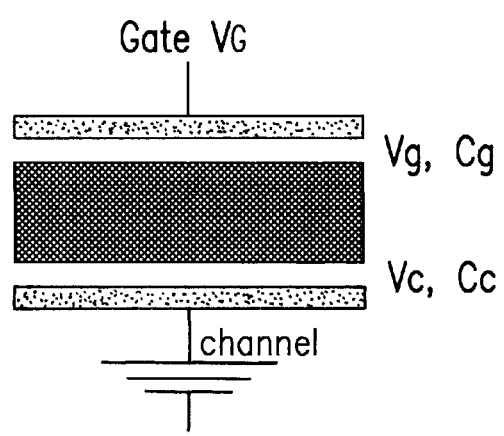
FIG. 2 schematically illustrates a double junction structure of a single layered floating quantum dots.
Figure 3:
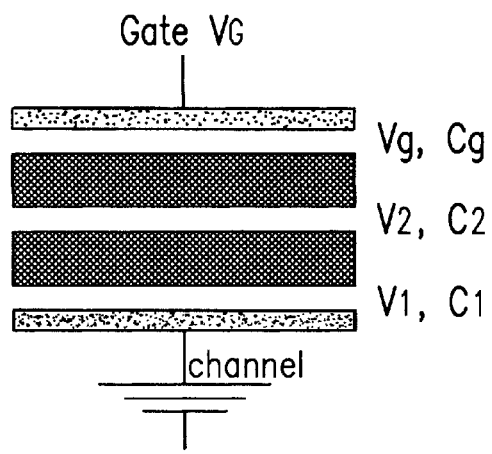
FIG. 3 schematically illustrates a triple junction structure of a double layered floating quantum dots.
Figure 4:
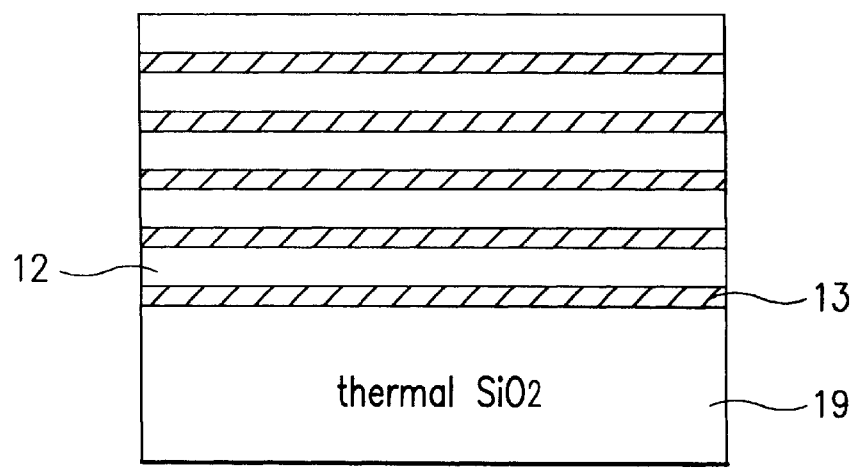
FIG. 4 schematically illustrates a multiple junction structure of a multilayered floating quantum dots.

Reference will now be made in detail to the preferred embodiments of the present invention, examples of which are illustrated in the accompanying drawings. FIG. 3 schematically illustrates a triple junction structure of a double layered floating quantum dots, and FIG. 4 schematically illustrates a multiple junction structure of a multilayered floating quantum dots.

An electrical performance of a device of the multilevel floating quantum dot structure can be calculated as follows. Important aspects in this calculation include the voltage regions exhibiting a voltage drop caused by an electron charge, a second voltage drop and a third voltage drop. First, in the case of a device of a double layered floating quantum dot structure shown in FIG. 3, the voltage drops when electrons are charged in a first layer and a second layer are calculated, respectively.

1) A gate voltage $V_G$ when there are no extra electrons in a first dot and a second dot is:

$$V_G = V_1 + V_2 + Vg,$$

and $$CgVg = C_2 V_2 = C_1 V_1$$

Therefore, voltages applied to respective junctions can be expressed by the equations below.

Equations (7);

$$V_1 = \frac{V_G}{\left(1 + \frac{C_1}{C_2} + \frac{C_2}{Cg}\right)} = \frac{C_2 C_g V_G}{C_1 C_2 + C_1 C_g + C_2 C_g}$$

$$V_2 = \frac{V_G}{\left(1 + \frac{C_2}{C_1} + \frac{C_2}{Cg}\right)} = \frac{C_1 C_g V_G}{C_1 C_2 + C_1 C_g + C_2 C_g}$$

$$V_g = \frac{V_G}{\left(1 + \frac{C_g}{C_1} + \frac{C_g}{C_2}\right)} = \frac{C_1 C_2 V_G}{C_1 C_2 + C_1 C_g + C_2 C_g}$$

2) The gate voltage $V_G$ when there is one extra electron charged in the first dot:

$$V_G = V_1 + V_2 + Vg,$$

and $$CgVg = C_2 V_2 = C_1 V_1 + e$$

Equations (8), $$V_1 = \frac{V_G - \frac{e}{C_g} - \frac{e}{C_2}}{\left(1 + \frac{C_1}{C_2} + \frac{C_1}{C_g}\right)} = \frac{C_2 C_g V_G - e(C_2 + C_g)}{(C_1 C_2 + C_1 C_g + C_2 C_g)}$$

A drop in $V_1$, a voltage changing a current of a channel, can be expressed by equation (9) shown below according to the aforementioned equations.

$$\Delta V_1(ii - i) = \frac{e(C_2 + C_g)}{(C_1 C_2 + C_1 C_g + C_2 C_g)} \quad (9)$$

That is, equation (9) represents a drop in voltage applied to the channel when the extra electron is charged in the first dot.

3) The gate voltage $V_G$ when there is one extra electron charged in each the first dot and the second dot.

$$V_G = V_1 + V_2 + Vg,$$

and $$CgVg = C_2 V_2 + e = C_1 V_1 + 2e$$

Thus, voltages applied to respective junctions can be expressed by equations (10) as below.

Equations (10);

$$V_1 = \frac{V_G - \frac{2e}{C_g} - \frac{e}{C_2}}{\left(1 + \frac{C_1}{C_2} + \frac{C_1}{C_g}\right)} = \frac{C_2 C_g V_G - e(C_2 + C_g)}{(C_1 C_2 + C_1 C_g + C_2 C_g)}$$

$$V_2 = \frac{V_G + \frac{e}{C_1} - \frac{e}{C_g}}{\left(1 + \frac{C_2}{C_1} + \frac{C_2}{C_g}\right)} = \frac{C_1 C_g V_G - e(C_g - C_1)}{(C_1 C_2 + C_1 C_g + C_2 C_g)}$$

$$V_g = \frac{V_g + \frac{2e}{C_1} + \frac{e}{C_2}}{\left(1 + \frac{C_g}{C_1} + \frac{C_g}{C_2}\right)} = \frac{C_1 C_2 V_G - e(C_1 + 2C_2)}{(C_1 C_2 + C_1 C_g + C_2 C_g)}$$

Similar to the previous case, the important aspect in the above equations is the drop in $V_1$ due to the charges because $V_1$ determines the current flowing through the channel.

A difference between the state when no electrons are charged in the first and second dots, and $V_1$ is defined as $\Delta V_1(iii-i)$, and a difference between the state when one electron is charged in the first dot and $V_1$ is defined as $\Delta V_1(iii-ii)$, wherein the differences can be expressed by equations (11) as follows.

Equations (11);

$$\Delta V_1(iii - i) = \frac{e(2C_2 + C_g)}{(C_1 C_2 + C_1 C_g + C_2 C_g)}$$

$$\Delta V_1(iii - ii) = \frac{eC_2}{(C_1 C_2 + C_1 C_g + C_2 C_g)}$$

A voltage at which a charging occurs can be expressed by the equation shown below, similar to the method above. Respective conditions of tunneling can be obtained by calculating a difference of energy. First, the condition of electron charge to the first dot can be expressed as follows.

$$E(ii) - E(i) = \left(\frac{1}{2} C_1 V_1^2(ii) + \frac{1}{2} C_2 V_2^2(ii) + \frac{1}{2} Cg Vg^2(ii)\right) -$$
$$\left(\frac{1}{2} C_1 V_1^2(i) + \frac{1}{2} C_2 V_2^2(i) + \frac{1}{2} Cg Vg^2(i)\right)$$
$$= \frac{e^2(C_2 + C)_g}{2(C_1 C_2 + C_1 C_g + C_2 C_g)} = eV_G$$

Therefore, the gate voltage required for charging an extra electron into the first dot can be expressed as follows.

$$\Delta V_G(ii) = \frac{e(C_2 + C_g)}{2(C_1 C_2 + C_1 C_g + C_2 C_g)}$$

And, a condition for charging electrons into the first and second dots can be obtained by setting $E(iii)-E(i)=eV_G$.

$$E(iii) - E(i) = (1/2(C_1 V_1^2(iii)) + 1/2(C_2 V_2^2(iii)) + 1/2(Cg Vg^2(iii))) -$$
$$(1/2(C_1 V_1^2(i)) + 1/2(C_2 V_2^2(i)) + 1/2(Cg Vg^2(i)))$$
$$= \frac{e^2(C_1 + 4C_2 + C_g)}{2(C_1 C_2 + C_1 C_g + C_2 C_g)} = eV_G$$

Therefore, a transition is occurred when $$\Delta V_G(iii) = \frac{e(C_1 + 4C_2 + C_g)}{2(C_1C_2 + C_1C_g + C_2C_g)}$$

Although there are additional circuit analysis aspects for a method of storing information utilizing a change of current flowing through the channel due to the aforementioned voltage drop, the possibility of employing a multiple digit device using the aforementioned quantized change in the SET can be verified. Also, for using this phenomena in a memory, the current change exhibited in the charging should be large enough to detect. A structure of the memory for implementing this is also the subject of discussion.

Voltage drops in each of the charging states can be obtained using the aforementioned equations. First, the voltage drops when all capacitances are assumed to be 1.6 aF are as follows.

$$\Delta V_1(ii-i) = \frac{e(C_2 + C_g)}{(C_1C_2 + C_1C_g + C_2C_g)} = 0.067 \text{ V}$$

$$\Delta V_1(iii-i) = \frac{e(2C_2 + C_g)}{(C_1C_2 + C_1C_g + C_2C_g)} = 0.1 \text{ V}$$

$$\Delta V_1(iii-ii) = \frac{e(2C_2 + C_g)}{(C_1C_2 + C_1C_g + C_2C_g)} = 0.1 \text{ V}$$

$$\Delta V_1(iii-ii) = \frac{eC_2}{(C_1C_2 + C_1C_g + C_2C_g)} = 0.033 \text{ V}$$

And, a voltage required for causing tunneling is as follows.

$$V_G(ii) = \frac{e(C_2 + C_g)}{2(C_1C_2 + C_1C_g + C_2C_g)} = -.033 \text{ V}$$

$$V_G(iii) = \frac{e(C_1 + 4C_2 + C_g)}{2(C_1C_2 + C_1C_g + C_2C_g)} = -.01 \text{ V}$$

When a thickness of the gate oxide film is increased to lower the Cg, to for example, 1 aF, for preventing malfunction of the device due to re-tunneling of an electron charged in the floating quantum dot to the gate, the following voltage drops can be obtained.

$$\Delta V_1(ii-i) = \frac{e(C_2 + C_g)}{(C_1C_2 + C_1C_g + C_2C_g)} = 0.072 \text{ V}$$

$$\Delta V_1(iii-i) = \frac{e(2C_2 + C_g)}{(C_1C_2 + C_1C_g + C_2C_g)} = 0.117 \text{ V}$$

$$\Delta V_1(iii-ii) = \frac{eC_2}{(C_1C_2 + C_1C_g + C_2C_g)} = 0.045 \text{ V}$$

The voltages required for causing a tunneling will be as follows.

$$V_G(ii) = \frac{e(C_2 + C_g)}{2(C_1C_2 + C_1C_g + C_2C_g)} = 0.036 \text{ V}$$

$$V_G(iii) = \frac{e(C_1 + 4C_2 + C_g)}{2(C_1C_2 + C_1C_g + C_2C_g)} = 0.125 \text{ V}$$

As seen from the above voltage values, the voltages required for causing tunneling is very low, e.g., approx. 0.1V when a capacitance in each junction is 1 to 2 aF, and thus the device of the present invention is advantageous in that the voltages required for operation of the device is very low. At the same time, as has been explained above, it is important that the current flowing at such a low voltage should be large enough to detect.

Accordingly, as verified in the aforementioned discussions, if a capacitance between each layer has a value of a few aF, the quantized voltage drop from the Coulomb blockade effect can be used for fabrication of a multi-digit device.

From the aforementioned discussion, the fabrication of a multi-digit device of a multilevel floating quantum dot structure is possible by using the quantized voltage change exhibited according to each charge state. Therefore, much research for fabricating the multilevel floating quantum dot structure which is very important for embodying such a multi-digit device has been conducted. In this regard, an Interface Agglomeration Process of Multilayer Structure will be explained as a new fabrication process for achieving the multilevel floating quantum dot structure. FIG. 4 schematically illustrates a multiple junction structure of multi-layered floating quantum dots. First of all, for Si-basic device fabrication, $Si_{0.7}Ge_{0.3}$ layers i.e., (Si added with 30% of Ge) are used for improving a mobility of atoms, using a selective oxidation effect of Ge in a heat treatment process, and changing quantum properties of the quantum dots. In order to verify changes of quantum dot formation and the electrical properties such as resonant tunneling according to addition of Ge, experiments are conducted in accordance with the change of Ge content. In the present invention, the results of the experiment on a 30% Ge content will be introduced.

As shown in FIG. 4, $SiO_2$ 19 is deposited on a single Si (100) substrate (not shown) by LPCVD at 400~550° C. (preferably at 425° C.) to approx. 200~300 A (preferably to 250 A), and a conductive layer 13 of $Si_{0.7}Ge_{0.3}$ is deposited again at 300~450° C. (preferably at 375° C.) to 20~50 A. And, then, the process is repeated, in which a CVD-$SiO_2$ insulating layer 12 is deposited at 300~450° C. (preferably at 375° C.) to 70~130 A, and $Si_{0.7}Ge_{0.3}$ is deposited again to 20~50 A, to form a multilayered structure as shown in FIG. 4. And, each of the $Si_{0.7}Ge_{0.3}$ layers deposited in series is subjected to heat treatment at 700~1000° C. in an $N_2$ ambient environment for 5~20 minutes (preferably 10 min.). Other than the $Si_{1-x.7}Ge_{x.3}$, other elements such as Si, Ge, Al, Au, Cu, Pt, Cr, Ru, Ta, Ti, and the like can be used, or an Si or Ge alloy of the aforementioned materials or an alloy between the aforementioned materials can be also used.

Figure 5A:
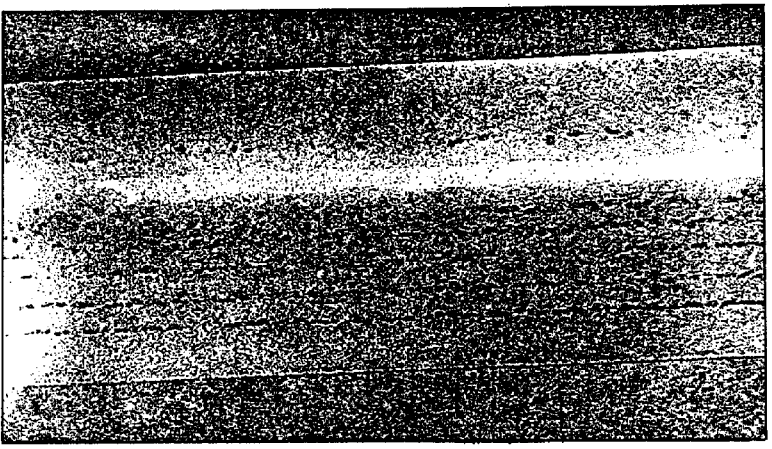
FIGS. 5a and 5b respectively illustrate TEM micrographs of $SiO_2/Si_{0.7}Ge_{0.3}/SiO_2$ sections heat treated at (a) 800° C. and (b) 900° C. respectively in an $N_2$ ambient environment for 10 minutes.; and, FIG. 6 illustrates a section of an E²PROM of a multilevel quantum dot structure in accordance with a preferred embodiment of the present invention.
Figure 5B:
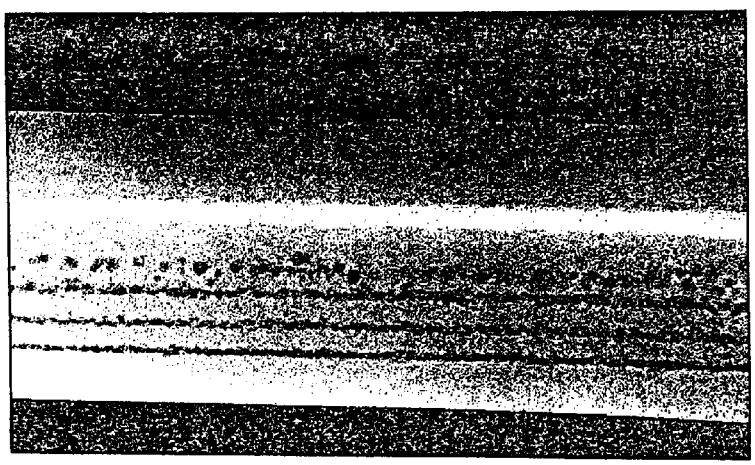

FIGS. 5a and 5b respectively illustrate TEM micrographs of $SiO_2/Si_{0.7}Ge_{0.3}/SiO_2$ sections heat treated at (a) 800° C. and (b) 900° C. respectively in an $N_2$ ambient environment for 10 min. As can be seen from FIG. 5a, all the five $Si_{0.7}Ge_{0.3}$ layers form quantum dots in 800° C. heat treatment, with a diameter of a quantum dot being approx. 49 A. It is found that the distances between the quantum dots are greater for those quantum dots nearer to the top surface. As the heat treatment is conducted in a tube furnace with an atmospheric pressure having an $N_2$ ambient environment, the $Si_{0.7}Ge_{0.3}$ layers are partly oxidized by oxygen and water vapor present in the furnace. This can also be observed in the case of 900° C. heat treatment shown in FIG. 5b. As can be seen from FIG. 5b, a top-most $Si_{0.7}Ge_{0.3}$ layer, nearest to the surface, has disappeared. This result is also considered to be caused by influences from the oxygen and water vapor present in the furnace. It can be known from the above results that it is possible to form a multilevel floating quantum dot structure using an interface agglomeration process of a multilayer structure, and it is possible to control a size and distribution of quantum dots using effects like selective oxidation depending on alloys other than a mere agglomeration. The size and distribution of the quantum dots can be controlled by partial oxidation if the alloy or a semiconductor material comprises one material which is easy to oxidize, and another material which is difficult to oxidize. Systems to which selective oxidation can be applicable may be a variety of alloy series, such as $Si_{1-x}Ge_x$ or $Si_{1-x}Au_x$. In the aforementioned case of using, not only agglomeration, but also selective oxidation, that electrical characteristics of the device can be varied with varied contents of materials in each alloy layer in the multilayer, which varied contents allow varied size and distribution of quantum dots in each layer after the heat treatment. The formation of layers having different sizes and distributions of quantum dots between the layers within one structure, a variety of applications can be achieved.

Figure 6:
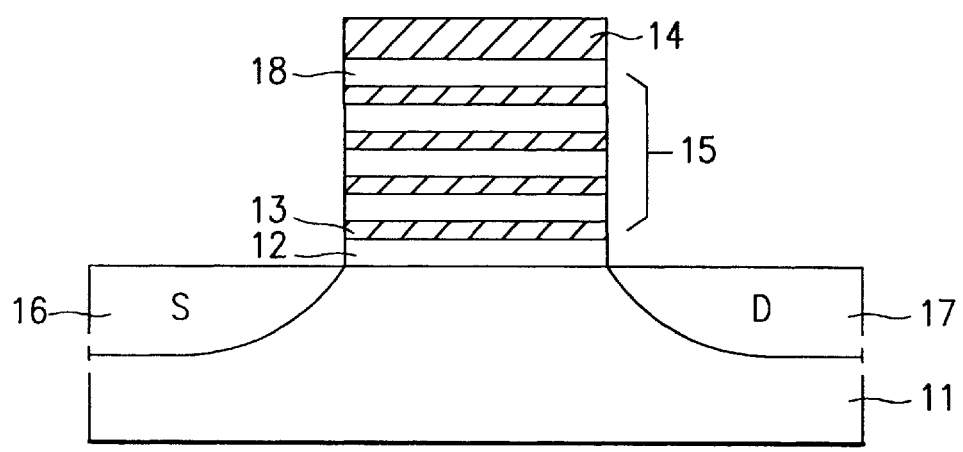

FIG. 6 illustrates a section of an $E^2PROM$ with a multilevel quantum dot structure in accordance with a preferred embodiment of the present invention. That is, instead of a single layer floating gate, a multilayered quantum dot structure is fabricated according to the aforementioned method in fabrication of an $E^2PROM$.

That is, a process including the steps of depositing a first insulating layer 12 of CVD-SiO 2 on a semiconductor substrate 11 at 300~450° C. (preferably at 375° C.) to 70~130 A (preferably to 100 A) and depositing a conductive layer 13 of $Si_{0.7}Ge_{0.3}$ again to 20~50 A (preferably 30 A) is repeated at least once. Then, in order to alter the series of $Si_{0.7}Ge_{0.3}$ layers into quantum dots, the $Si_{0.7}Ge_{0.3}$ layers are subjected to heat treatment at 700~1000° C. in a $N_2$ ambient environment for 5~20 minutes (preferably for 10 minutes). Other than the $Si_{1-x7}Ge_{x3}$, the conductive layer may be formed of Si, Ge, Al, Au, Cu, Pt, Cr, Ru, Ta, Ti, and the like, or an Si or Ge alloy of the aforementioned materials, or an alloy between the aforementioned materials. After altering the conductive layers into quantum dot layers, a second insulating layer 18 and an electrode interconnection layer are formed on a top-most conductive layer. Thereafter, the first insulating layer 12, the conductive layer 13, the second insulating layer 18 and the electrode interconnection layer are selectively removed to form a control gate 14 and a floating gate 15. Then, the control gate 14 is used as a mask for injecting impurity ions into the semiconductor substrate 11 on both sides of the control gate 14, to form source/drain impurity regions 16 and 17. The $E^2PROM$ fabricated in accordance with the present invention has multilayers comprising the floating gate, particularly, not of metal or doped semiconductor material, but quantum dot layers.

The memory of a multilevel quantum dot structure and a method for fabricating the same as explained has the following advantages.

First, an SET of a single layered floating dot structure similar to an EPROM can be used in a binary memory by utilizing a Coulomb blockade effect and a quantized voltage drop.

Second, an SET of a multilayered floating dot structure similar to an EPROM can be effectively used in a multidigit device by utilizing a voltage drop caused by immigration of charges between a channel and each floating dot layer.

Third, formation of a multilayered floating dot structure is possible by employing an interface agglomeration process of a multilayer structure. And, a size and a distribution of the quantum dots can be controlled by using selective oxidation and the like, besides using agglomeration.

It will be apparent to those skilled in the art that various modifications and variations can be made in the memory of a multilevel quantum dot structure and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor memory of a multilevel quantum dot structure, comprising the steps of:

(1) forming a first insulating layer on a substrate;

(2) repeating formation of a conductive layer and a second insulating layer on the first insulating layer at least once; and, (3) agglomerating each of the conductive layers to form quantized dot layers.

2. A method as claimed in claim 1, wherein the first and second insulating layers are formed of silicon oxide.

3. A method as claimed in claim 1, wherein the conductive layer is formed of, a material selected from a group comprising Si, Ge, $Si_{1-x}Ge_x$, Al, Au, Cu, Pt, Cr, Ru, Ta, and Ti, or an Si alloy ($Si_{1-x}$-Metal$_x$) of the aforementioned materials, or a Ge alloy ($Ge_{1-x}$-Metal$_x$) of the aforementioned materials, or an alloy (Metal$_{1-x}$-Metal$_x$) between the aforementioned materials, where 0<x<1.

4. A method as claimed in claim 1, wherein the step (3) includes step of heat treating in a vacuum ambient environment.

5. A method as claimed in claim 1, wherein the step (3) includes step of heat treating at 700~1000° C. in an $N_2$ ambient environment.

6. A method as claimed in claim 1, wherein the first insulating layer is formed to a thickness of 200~300 Å, the conductive layer is formed to a thickness of 20~50 Å, and the second insulating layer is formed to a thickness of 100~150 Å.

7. A method for fabricating a memory of a multilevel quantum dot structure, comprising the steps of:

(1) repeating formation of a first insulating layer and a conductive layer on a semiconductor substrate at least once;

(2) forming a second insulating layer on a top conductive layer;

(3) agglomerating each of the conductive layers to form quantum dot layers;

(4) forming a conductive layer for use as electrodes on the second insulating layer;

(5) selectively removing the conductive layers for use as electrodes and the quantum dots, and the first and second insulating layers, to form a control gate of the conductive layer and a floating gate of the repetitively formed conductive layers; and, (6) using the control gate and the floating gate as a mask in forming source/drain impurity regions in the semiconductor substrate.

8. A method as claimed in claim 7, wherein the first and second insulating layers are formed of silicon oxide, and the conductive layer is formed of $Si_{0.7}Ge_{0.3}$.

9. A method as claimed in claim 7, wherein the first and second insulating layers are formed to a thickness of 100~150 Å respectively, and the conductive layer is formed to a thickness of 20~50 Å.

10. A method of fabricating a semiconductor memory comprising:

forming a layered structure, the layered structure having alternating insulation layers and conductive layers;

processing the insulation and conductive layers to form quantum dots in the conductive layers; and forming a gate electrode on a top-most insulation layer; and forming a semiconductor channel beneath the plurality of insulation and conductive layers, wherein the conductive layers respectively having a different quantum dot structure, and the conductive layers being electrically coupled with the semiconductor channel by Coulomb blockade effect.

11. The method of claim 10, wherein the processing step controls a size and a distribution of the quantum dots.

12. The method of claim 11, wherein the processing step employs agglomeration.

13. The method of claim 11, wherein the processing step employs selective oxidation.

* * * * *